(12) United States Patent
Sahandiesfanjani et al.

(10) Patent No.: US 7,142,047 B2
(45) Date of Patent: Nov. 28, 2006

(54) OFFSET CANCELLATION IN A SWITCHING AMPLIFIER

(75) Inventors: Farzad Sahandiesfanjani, Santa Clara, CA (US); Babak Mazda, Mountain View, CA (US)

(73) Assignee: Tripath Technology, Inc., San Jose, CA (US)

( * ) Notice: Subject to any disclaimer, the term of this patent is extended or adjusted under 35 U.S.C. 154(b) by 81 days.

(21) Appl. No.: 11/000,215

(22) Filed: Nov. 29, 2004

(65) Prior Publication Data

US 2006/0114056 A1    Jun. 1, 2006

(51) Int. Cl.
*H03F 1/02* (2006.01)

(52) U.S. Cl. ............................. 330/9; 327/307

(58) Field of Classification Search .............. 330/9; 381/94.5; 327/124, 307
See application file for complete search history.

(56) References Cited

U.S. PATENT DOCUMENTS

| | | | | |
|---|---|---|---|---|
| 4,365,204 A | * | 12/1982 | Haque | 327/337 |
| 4,495,470 A | | 1/1985 | Bristol | 330/9 |
| 4,843,339 A | | 6/1989 | Burt et al. | 330/10 |
| 5,124,663 A | * | 6/1992 | McEntarfer et al. | 330/9 |
| 5,262,957 A | | 11/1993 | Hearn | 702/76 |
| 5,298,898 A | | 3/1994 | Brunheim | 341/118 |
| 5,352,986 A | | 10/1994 | Modgil et al. | 330/10 |
| 5,631,603 A | | 5/1997 | Stubbe et al. | 330/9 |
| 5,757,219 A | | 5/1998 | Weedon et al. | 327/307 |
| 5,777,512 A | | 7/1998 | Tripathi et al. | 330/207 A |
| 5,789,974 A | | 8/1998 | Ferguson, Jr. et al. | 330/2 |
| 5,867,777 A | | 2/1999 | Yamaji et al. | 455/234.1 |
| 5,917,378 A | | 6/1999 | Juang | 330/253 |
| 5,990,734 A | | 11/1999 | Wright et al. | 330/2 |
| 6,060,262 A | | 5/2000 | Beer-Romero et al. | 435/15 |
| 6,140,872 A | | 10/2000 | McEldowney | 330/9 |
| 6,141,169 A | | 10/2000 | Pietruszynski et al. | 330/67 |
| 6,316,992 B1 | | 11/2001 | Miao et al. | 360/67 |
| 6,724,248 B1 | | 4/2004 | Llewellyn | 330/9 |
| 2004/0227567 A1 | | 11/2004 | Llewellyn | |

* cited by examiner

*Primary Examiner*—Benny Lee
*Assistant Examiner*—Alan Wong
(74) *Attorney, Agent, or Firm*—Beyer Weaver & Thomas LLP

(57) ABSTRACT

A switching circuit is described having an input stage having an input referred offset voltage associated therewith. An output stage has an output offset voltage associated therewith which is due at least in part to the input referred offset associated with the input stage. Offset cancellation circuitry is operable to cancel a portion of the input referred offset voltage before switching of the output stage is enabled thereby resulting in cancellation of the portion of the output offset voltage after switching of the output stage begins. The offset cancellation circuitry is further operable to release the input referred offset voltage after switching of the output stage begins thereby allowing the output offset voltage to drift.

30 Claims, 3 Drawing Sheets

OFFSET CANCELLATION IN A SWITCHING AMPLIFIER

BACKGROUND OF THE INVENTION

The present invention relates to switching amplifier and regulator architectures, and more specifically reducing DC offset voltages in such architectures.

In virtually any amplification system, a standard design goal is the minimization of DC offset voltage. DC offset voltage is defined as a non-zero DC voltage observed at the amplifier output when zero DC voltage is applied to the input. In an audio amplifier, the DC offset voltage can appear suddenly at the output terminals (and thus at the speakers) at the instant the amplifier is energized or activated, producing an unpleasant thump or pop. This phenomenon is observed in both linear and switching (class-D) amplifiers and comes from a variety of sources.

Minimization of DC offset voltage can be achieved by the use of carefully matched circuit elements, by adaptive (i.e., self-adjusting) mechanisms, or both. Some amplification systems are designed with relays between their output stages and the speakers that are open at the time the amplifier is energized and close only after a very slow acting continuous time servo loop has had sufficient time to null the output offset. The use of relays is costly, however, and can impact reliability as well. The slow acting servo loop also requires a time constant that is large (it must be significantly greater than the period of the lowest audio frequency being amplified) and is therefore difficult to integrate onto a silicon chip. Digital implementation of this same form of slow, real-time servo loop requires a large number of bits (e.g., 16 or more) which is also prohibitive.

Other digital solutions have proven to be highly effective in reducing or eliminating both transient and steady-state DC offset voltages in a variety of applications. Such solutions are described in U.S. Pat. No. 6,724,248 for DC OFFSET SELF-CALIBRATION SYSTEM FOR A DIGITAL SWITCHING AMPLIFIER issued Apr. 20, 2004, and U.S. patent application Ser. No. 10/807,903 for DC OFFSET SELF-CALIBRATION SYSTEM FOR A SWITCHING AMPLIFIER filed Mar. 23, 2004, the entire disclosures of both of which are incorporated herein by reference for all purposes. However, not all applications, e.g., audio applications, require the ongoing mitigation of steady-state DC offset provided by such complex solutions. Rather, such applications could benefit in reduced area and complexity (and therefore cost) from a simpler, more straightforward approach to the problem of DC offset.

SUMMARY OF THE INVENTION

According to the present invention, solutions for dealing with offset voltages are provided. According to a specific embodiment, a switching circuit is provided having an input stage having an input referred offset voltage associated therewith. An output stage has an output offset voltage associated therewith which is due at least in part to the input referred offset associated with the input stage. Offset cancellation circuitry is operable to cancel a portion of the input referred offset voltage before switching of the output stage is enabled thereby resulting in cancellation of the portion of the output offset voltage after switching of the output stage begins. The offset cancellation circuitry is farther operable to release the input referred offset voltage after switching of the output stage begins thereby allowing the output offset voltage to drift.

According to another embodiment, a switching circuit includes an input stage having an input referred offset voltage associated therewith. An output stage has an output offset voltage associated therewith which is due at least in part to the input referred offset associated with the input stage. Offset cancellation circuitry includes an offset calibration capacitor and control circuitry which is operable before switching of the output stage is enabled to connect the offset calibration capacitor to an input terminal of the input stage, to charge the offset calibration capacitor to a predetermined voltage, and to facilitate discharging of the offset calibration capacitor until a portion of the input referred offset voltage associated with the input stage is canceled which results in cancellation of the portion of the output offset voltage after switching of the output stage begins. The control circuitry is further operable to disconnect the offset calibration capacitor from the input terminal after switching of the output stage begins thereby allowing the output offset voltage to drift.

According to yet another embodiment, a switching circuit includes an input stage having differential input terminals, differential output terminals, and an input referred offset voltage associated therewith. An output stage has an output offset voltage associated therewith which is due at least in part to the input referred offset associated with the input stage. Offset cancellation circuitry includes an offset calibration capacitor, a constant current source, and control circuitry which is operable before switching of the output stage is enabled to determine a polarity of the input referred offset voltage with reference to the differential output terminals, to connect the offset calibration capacitor to one of the differential input terminals of the input stage with reference to the polarity of the input referred offset voltage, to charge the offset calibration capacitor to a predetermined voltage, to connect the constant current source to the offset calibration capacitor thereby facilitating discharging of the offset calibration capacitor, and to disconnect the constant current source from the offset calibration capacitor upon detecting a polarity shift at the differential output terminals of the input stage which corresponds to cancellation of a portion of the input referred offset voltage associated with the input stage and results in cancellation of the portion of the output offset voltage after switching of the output stage begins. The control circuitry is further operable to disconnect the offset calibration capacitor from the one of the differential input terminals after switching of the output stage begins thereby allowing the output offset voltage to drift.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 1:
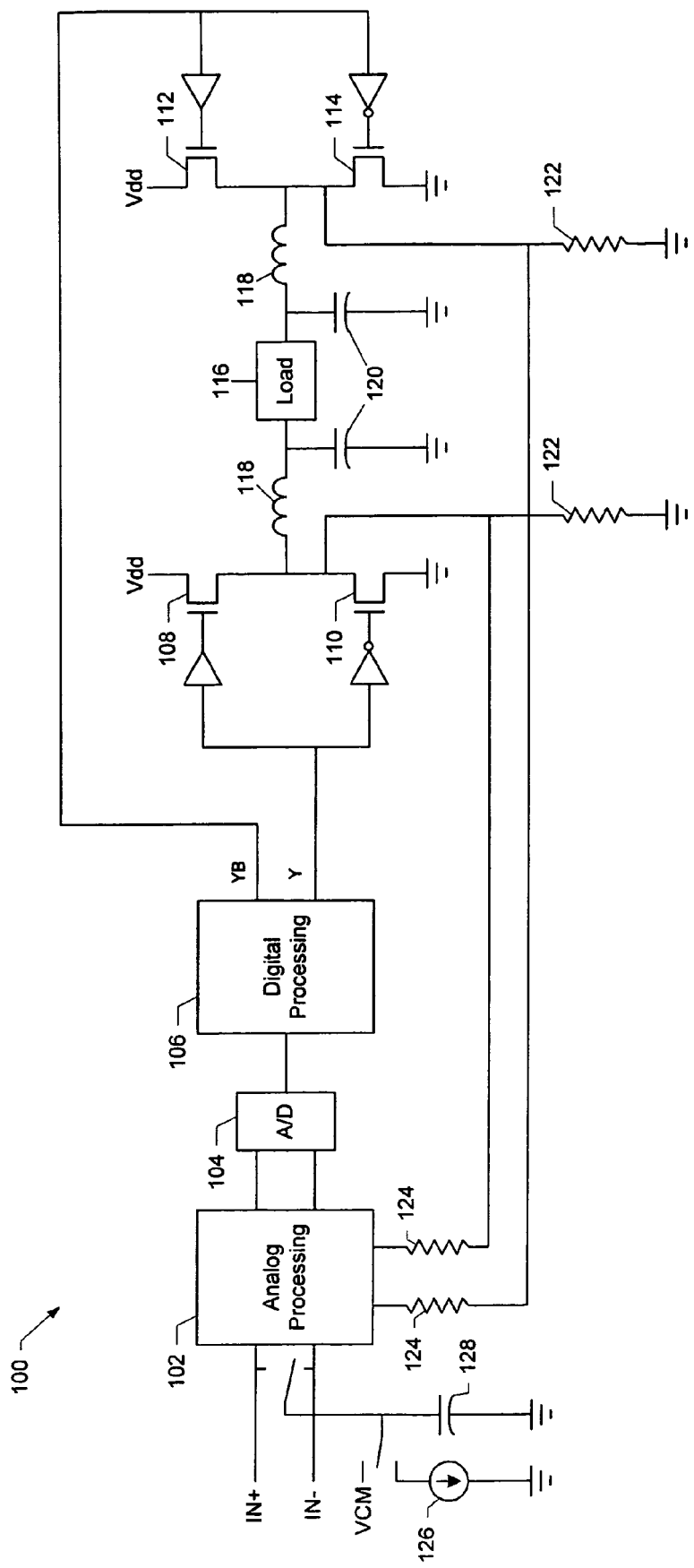
FIG. 1 is a simplified schematic of a switching amplifier implemented according to a specific embodiment of the invention.

FIG. 1 is a simplified schematic diagram of an exemplary switching amplifier 100 implemented according to a specific embodiment of the invention. For purposes of discussion, amplifier 100 may be thought of as a modified sigma delta modulator topology such as that described in U.S. Pat. No. 5,777,512 for METHOD AND APPARATUS FOR OVER-SAMPLED, NOISE-SHAPING, MIXED-SIGNAL PROCESSING issued Jul. 7, 1998, the entire disclosure of which is incorporated herein by reference for all purposes. However, it should be understood that the techniques described herein may be employed with a wide variety of amplifier and regulator architectures.

Amplifier 100 includes an analog processing block 102 which receives a differential analog input signal on inputs IN+ and IN− and, in one implementation, processes the input signal with multiple integrator stages. The output of analog processing block 102 is converted to digital form with A/D converter 104 which may comprise, for example, a comparator which generates a 1-bit representation of the processed analog signal. Digital processing block 106 generates complementary drive signals Y and YB from the 1-bit digital input. Complementary versions of each drive signal are then applied to the gates of output FETs 108–114 which drive load 116 via output filters comprising inductors 118 and capacitors 120. Continuous-time feedback is provided to analog processing block 102 via feedback resistors 122 and 124.

Figure 2:
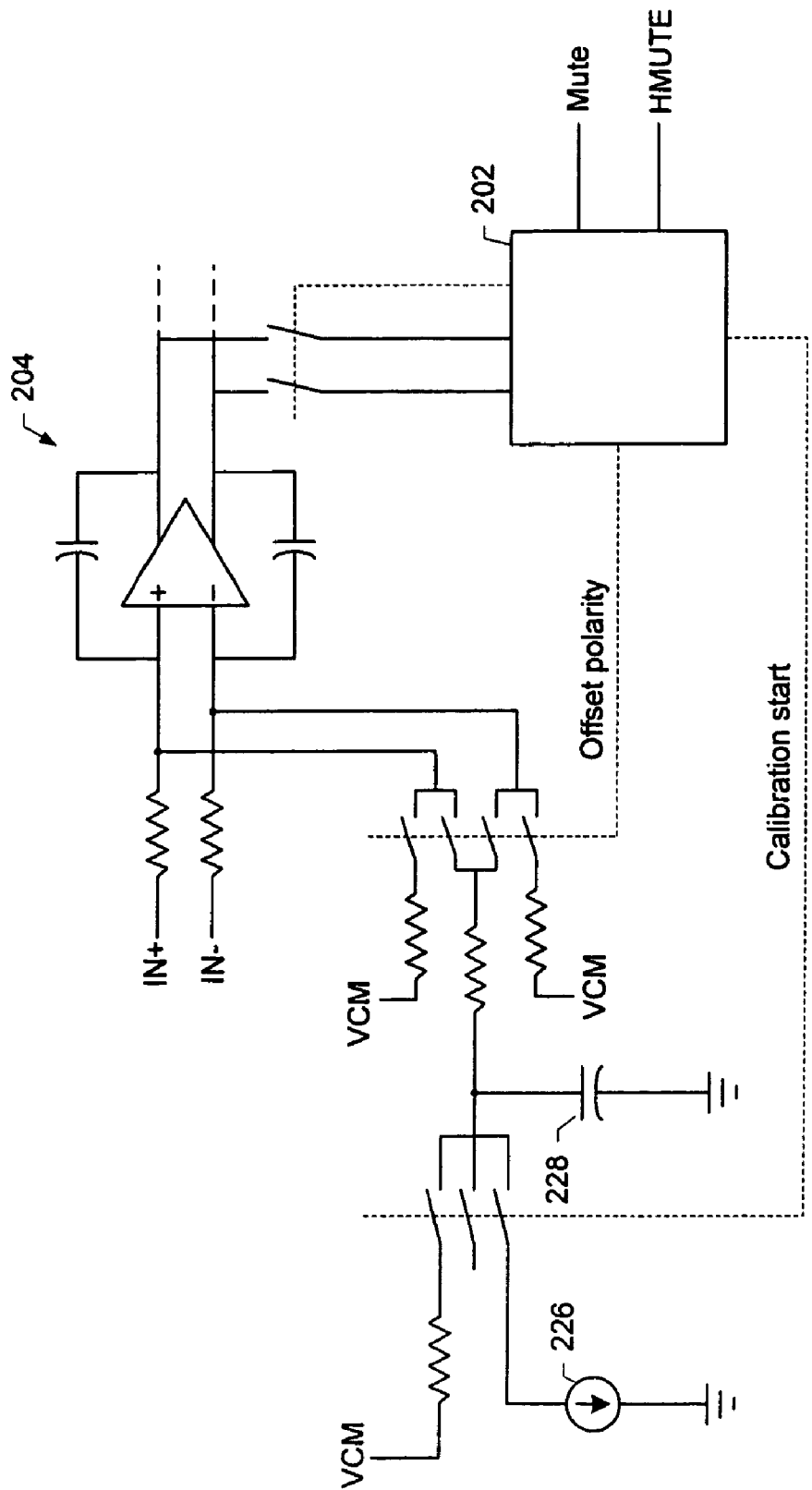
FIG. 2 is a more detailed schematic diagram of a portion of the schematic of FIG. 1.

Offset present at the load is fully or partially canceled prior to both muting and unmuting amplifier 100 through the interaction of constant current source 126 and calibration capacitor 128 which is coupled to one of inputs IN+ and IN−. The manner in which this is accomplished will be described with reference to FIGS. 2 and 3.

Figure 3:
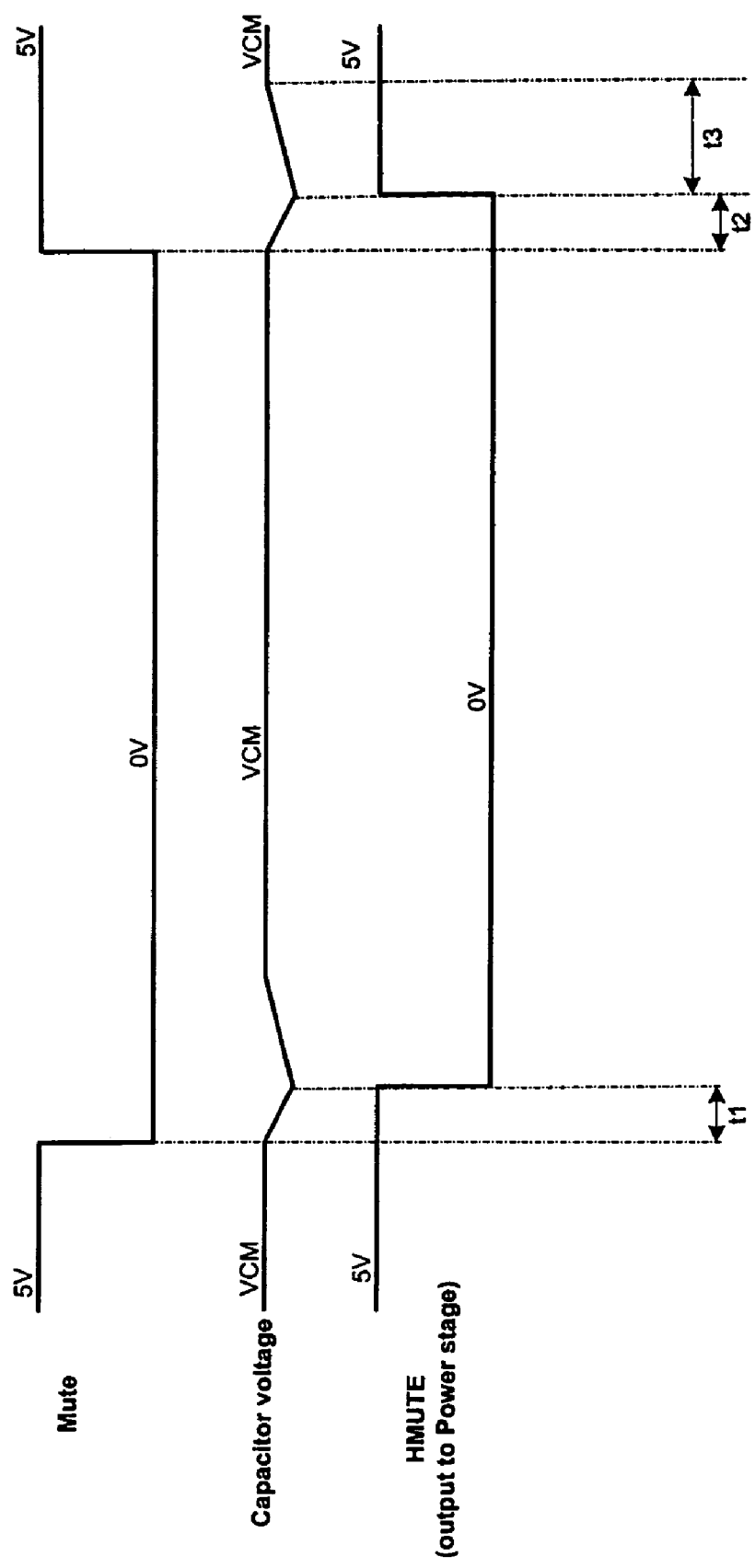
FIG. 3 is a timing diagram illustrating operation of a specific embodiment of the invention.

Just prior to fully unmuting the amplifier, i.e., before power is applied to load, power is applied to the analog processing block as represented by the Mute signal of FIG. 3 going from 5V to 0V. Controller 202 is temporarily coupled to the output of the first integrator stage (204) of the analog processing block to determine the polarity of the offset present at the load. That is, because the offset contribution of the first of multiple integrator stages dominates, the offset at the load will be of the same polarity as that present at the output of the integrator stage. Controller 202 connects both of inputs IN+ and IN− to VCM (e.g., 2.5 V), determines whether the open loop signal at the output of integrator 204 is at the positive or negative rail (thus indicating a positive or negative input referred offset), and stores the result for later use.

Depending on the polarity determined by controller 202, calibration capacitor 228 is connected to a corresponding one of inputs IN+ and IN−, i.e., IN+ for a positive offset and IN− for a negative offset, and then charged to the common mode voltage (VCM) of the analog processing block. According to a specific embodiment, controller 202 disconnects inputs IN+ and IN− from VCM only after calibration capacitor 228 is connected to the integrator input. This avoids allowing the integrator input to float. Calibration capacitor 228 is then connected to constant current source 226 for discharging. As current source 226 discharges calibration capacitor 228 from VCM (the middle trace of FIG. 3), the input to which the capacitor is connected is pulled down until controller 202 detects a change of polarity at the output of integrator 204. The output polarity change indicates that the input referred offset attributable to integrator 204 (and therefore most or all of the offset at the load) has been canceled.

Controller 202 then disconnects calibration capacitor 228 from current source 226 and stores the time required to discharge calibration capacitor 228 to the point at which the polarity change occurred (i.e., t1 in FIG. 3). This time may be tracked using, for example, a simple up/down counter 206. Controller 202 also disconnects itself from the output of integrator 204 and amplifier switching is then allowed to begin as represented by the signal HMUTE in FIG. 3 transitioning from 5V to 0V.

For some period of time after switching begins, e.g., 200 μs, the voltage on capacitor 228 remains substantially constant. This time period is not apparent in FIG. 3 because of the time scale. Controller 202 then reconnects calibration capacitor 228 to VCM for recharging. Once the capacitor is fully recharged, controller 202 disconnects it from the input of integrator 204.

According to a specific embodiment, once the calibration capacitor is disconnected from the integrator input and until the amplifier is muted again, the offset at the load is released, i.e., allowed to float. It should be noted, however, that embodiments are contemplated in which this steady-state offset is controlled by some other mechanism.

When the amplifier is preparing for muting (as represented by the Mute signal of FIG. 3 going from 0V to 5V), controller 202 connects calibration capacitor 228 to the same one of inputs IN+ and IN− (i.e., with reference to the polarity information stored previously) and current source 226 to effect cancellation of the offset. However, because the amplifier is still switching, controller 202 does not monitor the polarity of output of integrator 204 to determine when the offset is cancelled. Instead, controller 202 allows calibration capacitor 228 to discharge for a predetermined period of time (i.e., t2 of FIG. 3) which corresponds to the value stored during the unmuting procedure described above, i.e., t2=t1. According to a specific embodiment, the up/down counter which counted up to determine t1 may simply count down to zero to determine t2.

Once the discharge time t2 elapses, controller 202 then disconnects calibration capacitor 228 from current source 226, and amplifier switching is stopped as represented by the HMUTE signal of FIG. 3 going from 0V to 5V. Calibration capacitor 228 is then recharged to VCM in preparation for any subsequent unmuting of the amplifier as described above.

Due to the increase in chip temperature during switching, it is possible that the frequency of the oscillator employed by the up/down counter to determine t1 and t2 will vary and that, as a result, t2 may differ from t1. Therefore, according to a specific embodiment, a current based oscillator is employed which has only a small temperature dependency. As a result, any temperature-related variation between t1 and t2 is rendered negligible.

According to various audio embodiments of the invention, the rate at which calibration capacitor is allowed to recharge is limited to ensure that the recharging is not audible to the human ear. According to a specific embodiment, calibration capacitor 228 is not allowed to recharge to VCM (which in one implementation is known to be less than or equal to 200 mV) in fewer than 50 milliseconds. This rate is represented by charging time t3 in FIG. 3.

Audio embodiments of the present invention may also be used in conjunction with squelching techniques which are intended to reduce or eliminate pop which is due not to input referred offset, but to signal energy abruptly dissipated in the load when muting or unmuting occurs. Without squelching, the contribution to pop due to attempts to instantaneously terminate or generate current in the output inductors (e.g., inductors 118 of FIG. 1) would dominate any contribution from offset. Therefore, according to a specific embodiment, the input to the first integrator stage is gradually unsquelched after unmuting and gradually squelched before muting. As will be understood, this may be done using any of a variety of well known techniques. It should also be noted that squelching of the input to the integrator would not be necessary in cases where the input signal is brought up and down gradually by other mechanisms or parts of the system.

A significant advantage of the present invention may be realized for audio applications in particular. That is, for audio applications, the main concern relating to offset is its reduction or elimination at muting and unmuting to avoid the unpleasant and potentially destructive pop at the speaker. Dealing with the ongoing or steady-state offset once switching has begun may not be necessary in many audio applications because it has little or no discernible effect on the output from the listener's perspective. As a result, the cost and consumption of chip area typically associated with solutions which attempt ongoing mitigation of offset may be avoided. It should be noted, however, that the present invention may be used in conjunction with any such solutions.

While the invention has been particularly shown and described with reference to specific embodiments thereof, it will be understood by those skilled in the art that changes in the form and details of the disclosed embodiments may be made without departing from the spirit or scope of the invention. For example, embodiments of the invention have been described herein with reference to specific topologies (e.g., differential, modified sigma delta modulators) and applications (e.g., audio). It will be understood, however, that the present invention may be employed in a variety of switching amplifier and regulator topologies, and for a wide variety of applications. For example, the present invention may be employed in a conventional sigma delta modulator, conventional digital or analog amplifier topologies, or in a single-ended amplifier topology (although additional measure to mitigate supply pumping may be necessary in a single-ended implementation). The present invention may also be used in any application in which some steady-state offset can be tolerated, or (as mentioned above) in conjunction with some other mechanism for minimizing steady state offset.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A switching circuit, comprising:
an input stage having an input referred offset voltage associated therewith;
an output stage having an output offset voltage associated therewith which is due at least in part to the input referred offset associated with the input stage; and
offset cancellation circuitry for temporarily canceling a portion of the output offset voltage, the offset cancellation circuitry being operable to cancel a portion of the input referred offset voltage associated with the input stage before switching of the output stage is enabled thereby resulting in cancellation of the portion of the output offset voltage after switching of the output stage begins, the offset cancellation circuitry further being operable to release the input referred offset voltage after switching of the output stage begins thereby allowing the output offset voltage to drift, wherein the offset cancellation circuitry comprises an offset calibration capacitor operable to be temporarily coupled to an input terminal of the input stage to effect cancellation of the portion of the input referred offset voltage, control circuitry operable to facilitate charging and discharging of the offset calibration capacitor, and a constant current source for facilitating discharging of the offset calibration capacitor.

2. The switching circuit of claim 1 wherein the offset cancellation circuitry is further operable after allowing the output offset voltage to drift and before switching of the output stage is disabled to cancel a further portion of the input referred offset voltage thereby canceling a further portion of the output offset voltage.

3. The switching circuit of claim 1 wherein the switching circuit comprises any of a switching amplifier, a switching regulator, a single-ended circuit, and a differential circuit.

4. The switching circuit of claim 1 wherein the switching circuit comprises an audio amplifier.

5. An electronic system comprising at least one of the switching circuit of claim 1.

6. A switching circuit, comprising:
an input stage having an input referred offset voltage associated therewith;
an output stage having an output offset voltage associated therewith which is due at least in part to the input referred offset associated with the input stage; and
offset cancellation circuitry for temporarily canceling a portion of the output offset voltage, the offset cancellation circuitry comprising an offset calibration capacitor and control circuitry which is operable before switching of the output stage is enabled to connect the offset calibration capacitor to an input terminal of the input stage, to charge the offset calibration capacitor to a predetermined voltage, and to facilitate discharging of the offset calibration capacitor until a portion of the input referred offset voltage associated with the input stage is canceled which results in cancellation of the portion of the output offset voltage after switching of the output stage begins, the control circuitry further being operable to disconnect the offset calibration capacitor from the input terminal after switching of the output stage begins thereby allowing the output offset voltage to drift.

7. The switching circuit of claim 6 wherein the control circuitry is operable to facilitate charging and discharging of the offset calibration capacitor at a sufficiently slow rate such that the charging and discharging of the offset calibration capacitor is not audible to a human ear.

8. The switching circuit of claim 6 wherein the offset cancellation circuitry further comprises a constant current source for facilitating discharging of the offset calibration capacitor.

9. The switching circuit of claim 6 wherein the control circuitry is further operable to determine a first time period required to discharge the offset calibration capacitor from the predetermined voltage until the portion of the input referred offset voltage is canceled.

10. The switching circuit of claim 9 wherein the control circuitry is further operable to facilitate subsequent cancellation of a further portion of the input referred offset voltage by facilitating discharge of the offset calibration capacitor from the predetermined voltage for the first time period.

11. The switching circuit of claim 6 wherein the control circuitry is further operable to determine a polarity of the input referred offset voltage and connect the offset calibration capacitor to the input terminal of the input stage in response thereto.

12. The switching circuit of claim 11 wherein the control circuitry is operable to determine the polarity with reference to an output voltage associated with a first stage of the input stage.

13. The switching circuit of claim 9 wherein the control circuitry is further operable before switching of the output stage is disabled to facilitate charging of the offset calibration capacitor to the predetermined voltage, to reconnect the offset calibration capacitor to the input terminal, to facilitate discharging of the offset calibration capacitor until a further portion of the input referred offset voltage is canceled thereby canceling a further portion of the output offset voltage.

14. The switching circuit of claim 13 wherein the control circuitry is further operable after switching of the output stage has been disabled to facilitate charging of the offset calibration capacitor to the predetermined voltage and then to disconnect the offset calibration capacitor from the input terminal.

15. The switching circuit of claim 6 wherein the switching circuit comprises any of a switching amplifier, a switching regulator, a single-ended circuit, and a differential circuit.

16. The switching circuit of claim 6 wherein the switching circuit comprises an audio amplifier.

17. An electronic system comprising at least one of the switching circuit of claim 6.

18. A switching circuit, comprising:
an input stage having differential input terminals, differential output terminals, and an input referred offset voltage associated therewith;
an output stage having an output offset voltage associated therewith which is due at least in part to the input referred offset associated with the input stage; and
offset cancellation circuitry for temporarily canceling a portion of the output offset voltage, the offset cancellation circuitry comprising an offset calibration capacitor, a constant current source, and control circuitry which is operable before switching of the output stage is enabled to determine a polarity of the input referred offset voltage with reference to the differential output terminals, to connect the offset calibration capacitor to one of the differential input terminals of the input stage with reference to the polarity of the input referred offset voltage, to charge the offset calibration capacitor to a predetermined voltage, to connect the constant current source to the offset calibration capacitor thereby facilitating discharging of the offset calibration capacitor, and to disconnect the constant current source from the offset calibration capacitor upon detecting a polarity shift at the differential output terminals of the input stage which corresponds to cancellation of a portion of the input referred offset voltage associated with the input stage and results in cancellation of the portion of the output offset voltage after switching of the output stage begins, the control circuitry further being operable to disconnect the offset calibration capacitor from the one of the differential input terminals after switching of the output stage begins thereby allowing the output offset voltage to drift.

19. The switching circuit of claim 18 wherein the control circuitry is further operable before switching of the output stage is disabled to reconnect the offset calibration capacitor to the one of the differential input terminals, to facilitate charging of the offset calibration capacitor to the predetermined voltage, and to reconnect the offset calibration capacitor to the constant current source thereby facilitating discharging of the offset calibration capacitor until a further portion of the input referred offset voltage is canceled thereby canceling a further portion of the output offset voltage.

20. The switching circuit of claim 19 wherein the control circuitry is further operable after switching of the output stage has been disabled to facilitate charging of the offset calibration capacitor to the predetermined voltage and to disconnect the offset calibration capacitor from the one of the differential input terminals.

21. The switching circuit of claim 18 wherein the predetermined voltage is the common mode voltage of the input stage.

22. The switching circuit of claim 21 wherein the input stage comprises a first one of multiple integrator stages.

23. The switching circuit of claim 21 wherein the control circuitry is operable to determine the polarity of the input referred offset voltage by connecting the differential input terminals to the common mode voltage, and wherein the control circuitry is further operable to connect the offset calibration capacitor to the one of the differential input terminals before disconnecting the differential input terminals from the common mode voltage.

24. The switching circuit of claim 18 wherein the control circuitry is further operable to determine a first time period required to discharge the offset calibration capacitor from the predetermined voltage until the portion of the input referred offset voltage is canceled.

25. The switching circuit of claim 24 wherein the control circuitry is further operable after switching of the output stage has begun to facilitate subsequent cancellation of a further portion of the input referred offset voltage by facilitating discharging of the offset calibration capacitor from the predetermined voltage for the first time period without reference to the differential output terminals.

26. The switching circuit of claim 25 wherein the control circuitry employs an up/down counter to determine the first period of time and to facilitate the subsequent cancellation of the further portion of the input referred offset voltage.

27. The switching circuit of claim 26 wherein the up/down counter counts up to determine the first period of time and down to facilitate discharging of the offset calibration capacitor.

28. The switching circuit of claim 18 wherein the switching circuit comprises any of a switching amplifier, a switching regulator, a single-ended circuit, and a differential circuit.

29. The switching circuit of claim 18 wherein the switching circuit comprises an audio amplifier.

30. An electronic system comprising at least one of the switching circuit of claim 18.

\* \* \* \* \*